(12) United States Patent
Nitta

(10) Patent No.: US 10,814,616 B2
(45) Date of Patent: Oct. 27, 2020

(54) INKJET HEAD, INKJET PRINTER, AND MANUFACTURING METHOD FOR INKJET HEAD

(71) Applicant: TOSHIBA TEC KABUSHIKI KAISHA, Tokyo (JP)

(72) Inventor: Noboru Nitta, Tagata Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/277,542

(22) Filed: Feb. 15, 2019

(65) Prior Publication Data
US 2019/0255840 A1    Aug. 22, 2019

(30) Foreign Application Priority Data
Feb. 20, 2018   (JP) ................. 2018-027576

(51) Int. Cl.
*B41J 2/045*     (2006.01)
*B41J 2/14*      (2006.01)
(Continued)

(52) U.S. Cl.
CPC ....... *B41J 2/04541* (2013.01); *B41J 2/04581* (2013.01); *B41J 2/14201* (2013.01);
(Continued)

(58) Field of Classification Search
CPC ............. B41J 2/04573; B41J 2/04581; B41J 2/14209; B41J 2/04595; B41J 2/04588;
(Continued)

(56) References Cited

U.S. PATENT DOCUMENTS 6,190,006 B1    2/2001   Kurashima et al.
2002/0149636 A1  10/2002  Takabayashi et al.
(Continued)

FOREIGN PATENT DOCUMENTS

JP      H11-235824 A    8/1999
JP      3525046 B2      5/2004
(Continued)

OTHER PUBLICATIONS

IP.com search (Year: 2020).*
(Continued)

*Primary Examiner* — Lisa Solomon
(74) *Attorney, Agent, or Firm* — Kim & Stewart LLP

(57) ABSTRACT

An ink jet head includes a head substrate, a printed board, and a plurality of flexible substrates connected in parallel to each other between the head substrate and the printed board. The head substrate includes a plurality of ink jet elements, and a common wire extending from an edge of the head substrate and electrically connected to the ink jet elements in common. The printed board includes a reference potential wire through which a reference potential is set to the ink jet head. A first one of the flexible substrates at a first end of an arrangement of the flexible substrates and a second one of the flexible substrates at a second end of the arrangement of the flexible substrates opposite to the first end each has a common connection wire electrically connected between the common wire and the reference potential wire.

20 Claims, 13 Drawing Sheets

(51) Int. Cl.
  *B41J 2/16* (2006.01)
  *H05K 1/18* (2006.01)
  *H01L 23/538* (2006.01)

(52) U.S. Cl.
  CPC ............ *B41J 2/1607* (2013.01); *B41J 2/1623* (2013.01); *B41J 2002/14459* (2013.01); *B41J 2002/14491* (2013.01); *B41J 2202/11* (2013.01); *B41J 2202/13* (2013.01); *B41J 2202/22* (2013.01); *H01L 23/5387* (2013.01); *H05K 1/189* (2013.01); *H05K 2201/09227* (2013.01); *H05K 2201/10681* (2013.01)

(58) Field of Classification Search
  CPC ................ B41J 2/04543; B41J 2/04525; B41J 2202/12; B41J 2202/10
  See application file for complete search history.

(56) References Cited

U.S. PATENT DOCUMENTS

| | | |
|---|---|---|
| 2003/0063449 A1 | 4/2003 | Suzuki et al. |
| 2007/0019060 A1 | 1/2007 | Suzuki |
| 2007/0222822 A1 | 9/2007 | Ito |
| 2012/0069527 A1 | 3/2012 | Yamashita |
| 2017/0217178 A1 | 8/2017 | Seki |
| 2017/0239940 A1 | 8/2017 | Yamashita |
| 2017/0341379 A1 | 11/2017 | Umeda et al. |

FOREIGN PATENT DOCUMENTS

| | | |
|---|---|---|
| JP | 2007083707 A | 4/2007 |
| JP | 2007-196433 A | 8/2007 |
| JP | 2009004278 A | 1/2009 |
| JP | 4815296 B2 | 11/2011 |

OTHER PUBLICATIONS

U.S. Appl. No. 16/276,117, filed Feb. 14, 2019 (First Inventor: Noboru Nitta).
U.S. Appl. No. 16/276,179, filed Feb. 14, 2019 (First Inventor: Noboru Nitta).
U.S. Appl. No. 16/278,934, filed Feb. 19, 2019 (First Inventor: Noboru Nitta).
Extended European Search Report dated Jun. 28, 2019. filed in counterpart European Patent Application No. 19158041.4, 11 pages.

\* cited by examiner

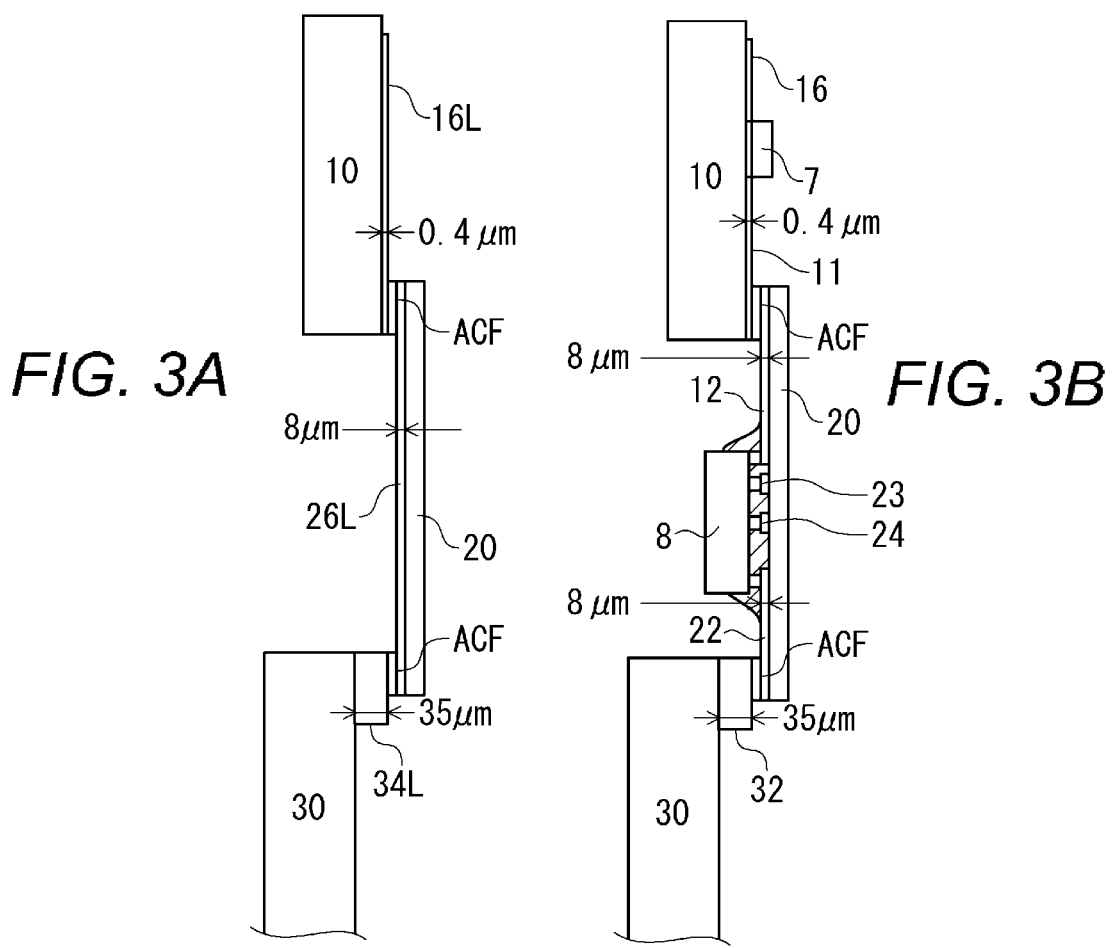
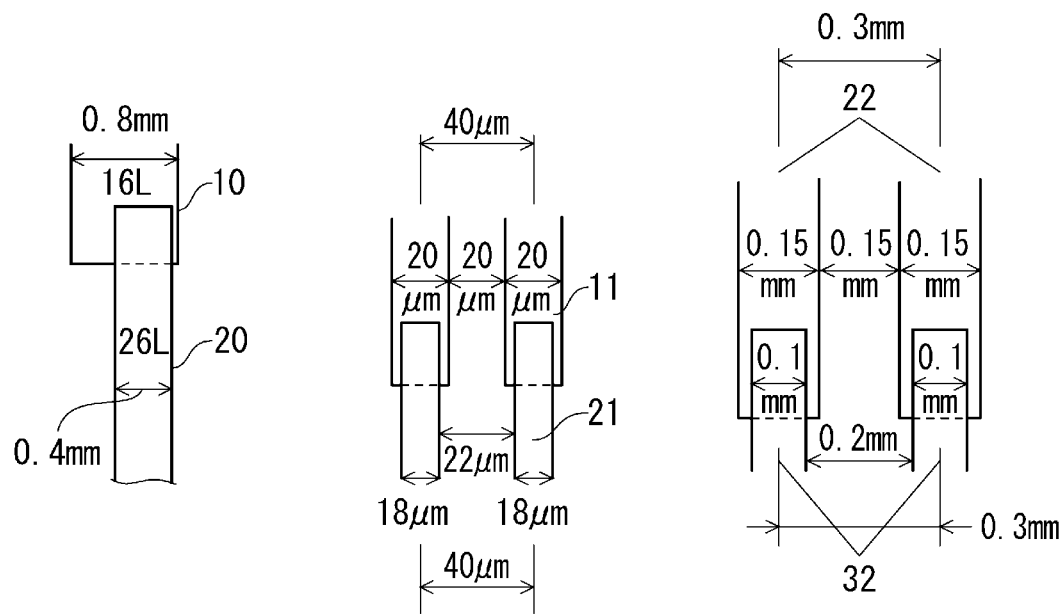

US 10,814,616 B2

1

INKJET HEAD, INKJET PRINTER, AND MANUFACTURING METHOD FOR INKJET HEAD

CROSS-REFERENCE TO RELATED APPLICATION

This application is based upon and claims the benefit of priority from Japanese Patent Application No. 2018-027576, filed Feb. 20, 2018, the entire contents of which are incorporated herein by reference.

FIELD

Embodiments described herein relate generally to an inkjet head, an inkjet printer, and a manufacturing method for the inkjet head.

BACKGROUND

An inkjet head includes a channel forming member in which a plurality of ink chambers are formed, a nozzle plate on which a plurality of nozzles that communicate with the ink chambers are formed, and a head substrate on which a plurality of elements, such as actuators, corresponding to the ink chambers are disposed.

The head substrate may be connected to a printer control section via a flexible substrate, a relay substrate, a cable, or the like. A driving integrated circuit (IC) chip that drives the plurality of elements may be mounted on the flexible substrate.

Driving power is output from the driving IC chip in accordance with a command from the printer control section and supplied to the elements. Consequently, deformation, heat generation, or the like of the elements occurs, an ink pressure in pressure chambers increases, and ink is thus ejected from the nozzles.

Individual wires for supplying a driving signal and a common wire for supplying reference potential (ground potential) are connected to the elements.

The common wire may be disposed in a separate path not on the flexible substrate or disposed through the driving IC chip on the flexible substrate.

If the common wire is disposed in a path separate from the flexible substrate, wiring may become long and complicated. Therefore, the common wire is more likely to be affected by noise or deterioration in a discharge characteristic due to a voltage drop is caused. Wire connecting work may be also complicated.

If the common wire is disposed through the driving IC chip on the flexible substrate, malfunction of the driving IC may occur because of noise propagating in the common wire. The common wire may need to be formed with a thin width, which may cause deterioration in discharge characteristics due to a voltage drop. If the common wire is widened, a mounting area of the driving IC chip may increase and a reduction in the size of an apparatus may be hindered.

2

Figure 2A:
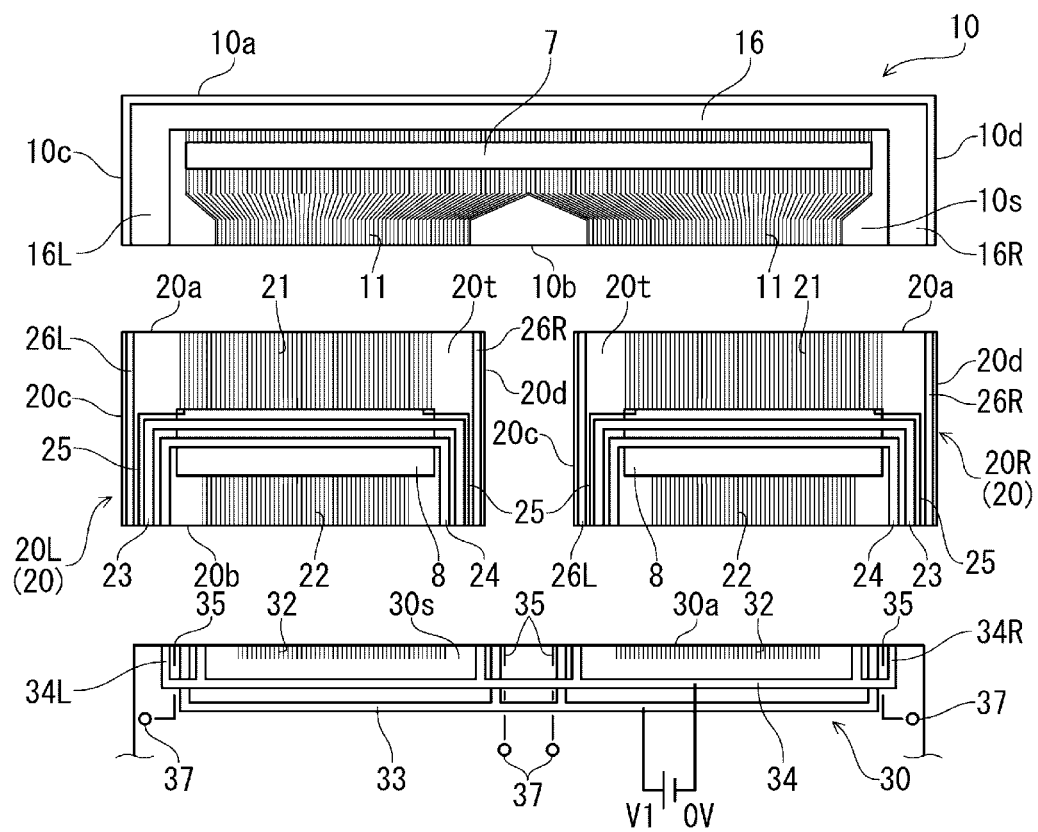
Figure 2B:
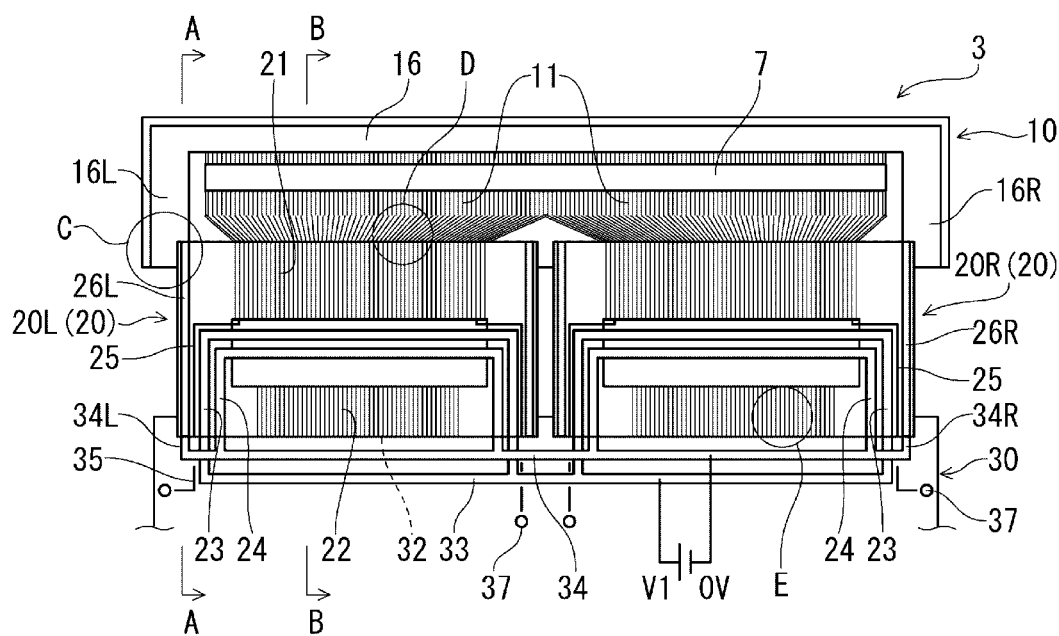

FIGS. 2A and 2B are diagrams illustrating the inkjet head, FIG. 2A illustrating the inkjet head before bonding and FIG. 2B illustrating the inkjet head after the bonding.

FIGS. 3A and 3E are diagrams illustrating the inkjet head, FIG. 3A being a cross-sectional view along A-A in FIG. 2B, FIG. 3B being a cross-sectional view along B-B in FIG. 2B, FIG. 3C being an enlarged view of a part C in FIG. 2B, FIG. 3D being an enlarged view of a part D in FIG. 2B, and FIG. 3E being an enlarged view of a part E in FIG. 2B.

Figure 4:
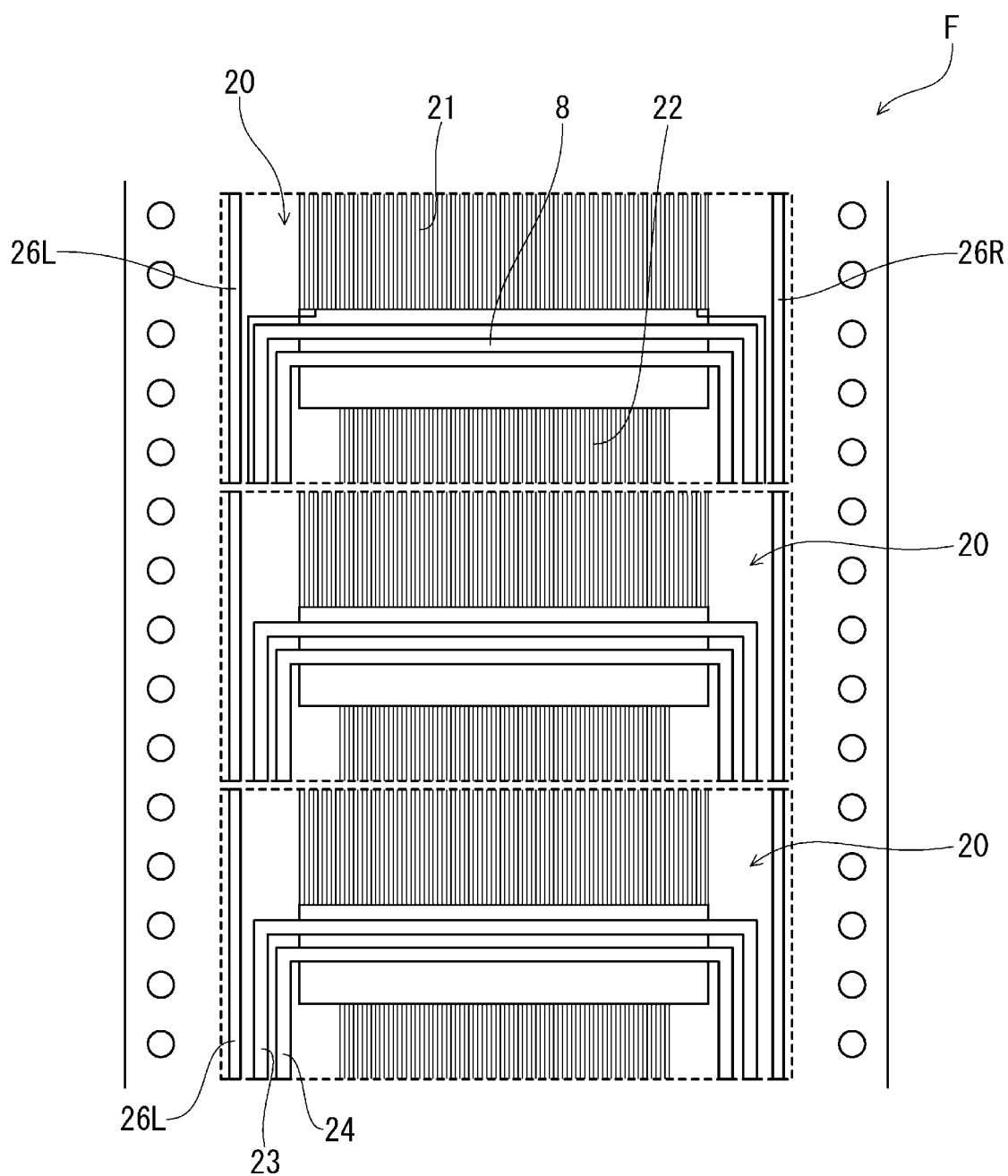

FIG. 4 is a diagram illustrating flexible substrates formed in a sprocket film.

Figure 5A:
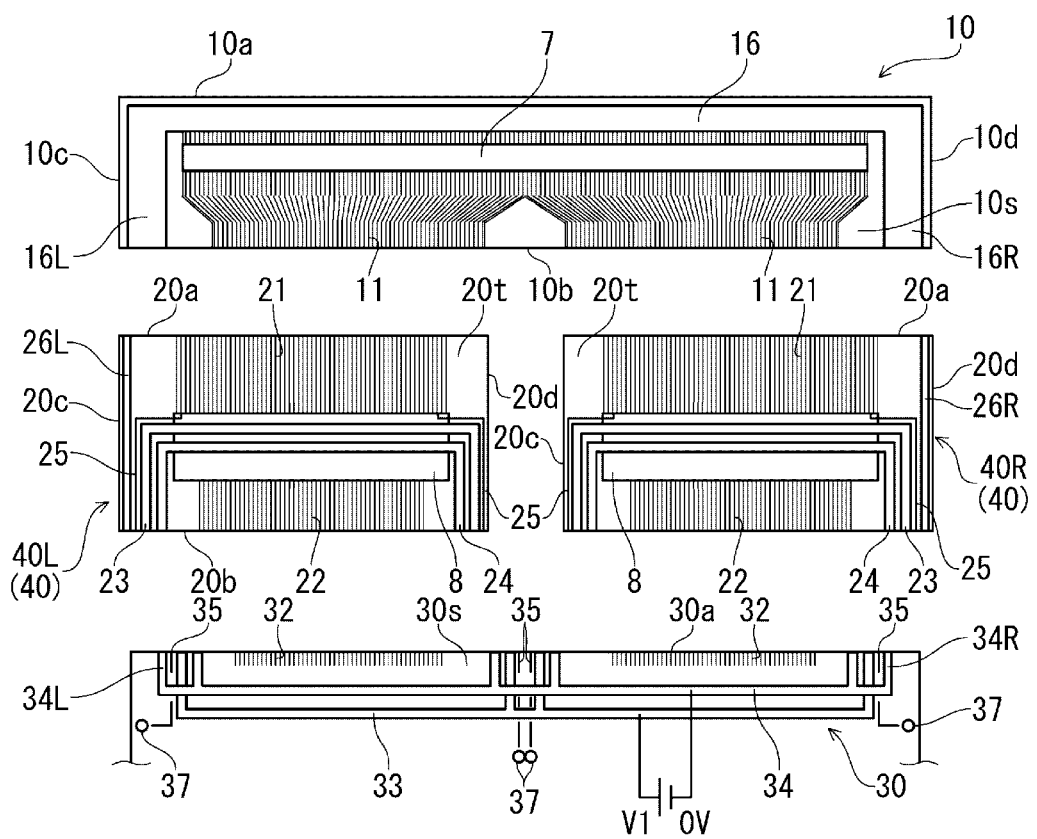
Figure 5B:
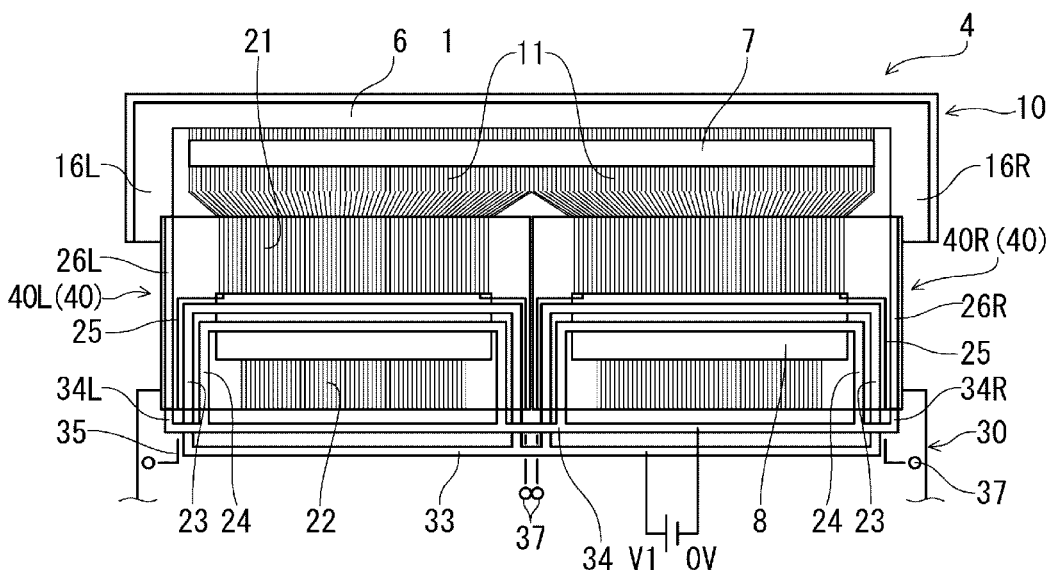

FIGS. 5A and 5B are diagrams illustrating an inkjet head according to a second embodiment, FIG. 5A illustrating the inkjet head before bonding and FIG. 5B illustrating the inkjet head after the bonding.

Figure 6:
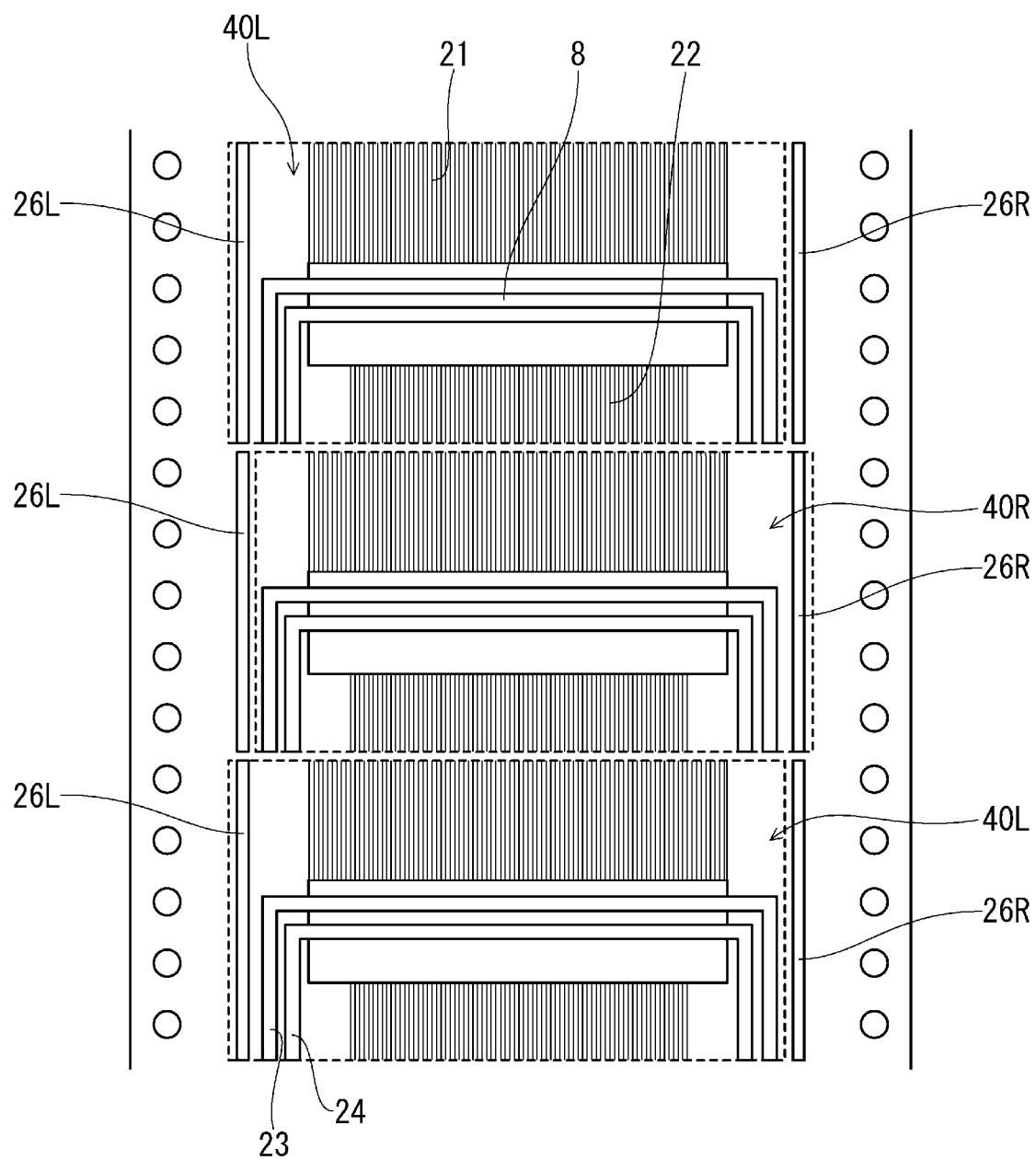

FIG. 6 is a diagram illustrating flexible substrates formed in a sprocket film.

Figure 7:
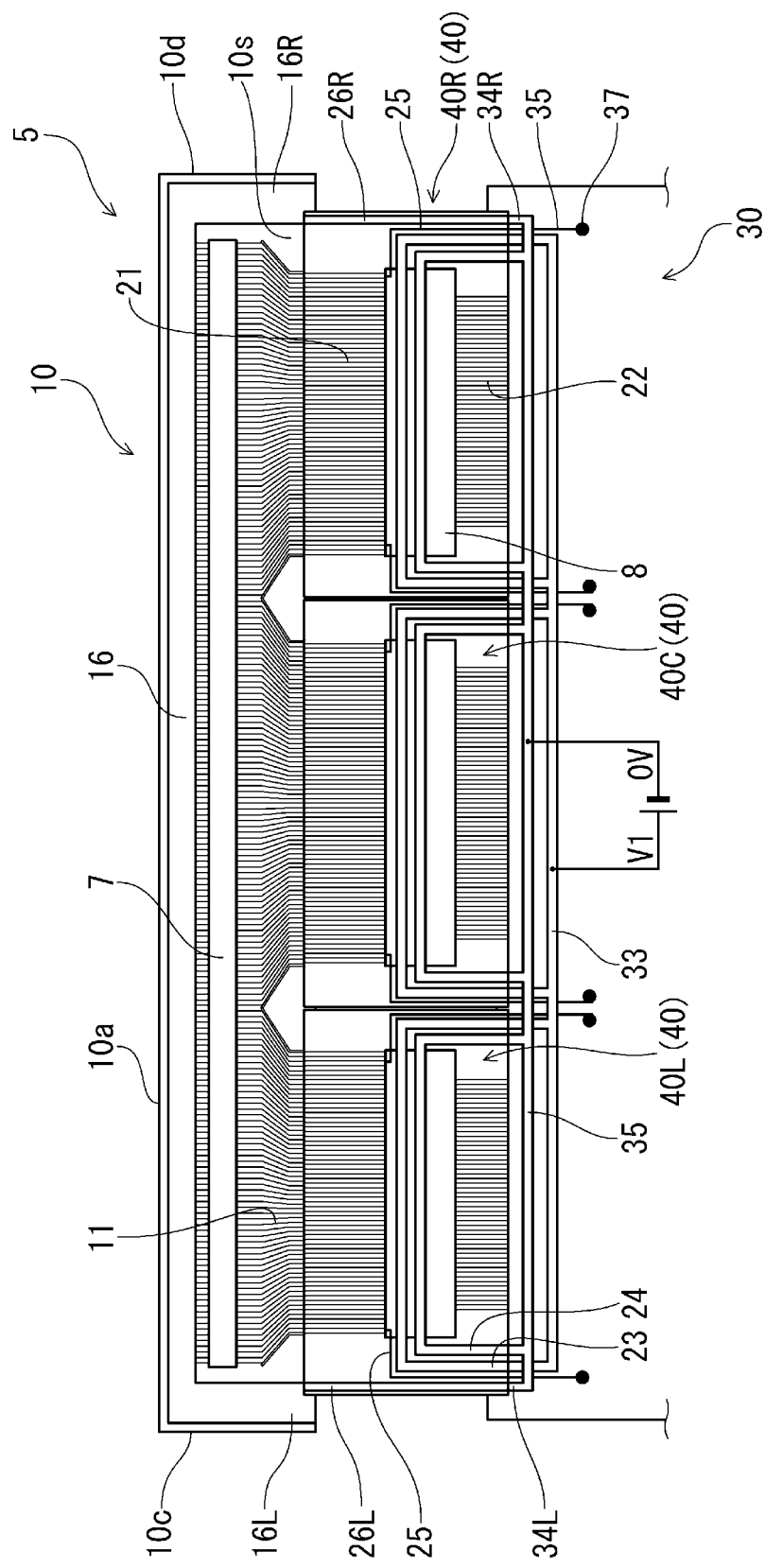

FIG. 7 is a diagram illustrating an inkjet head according to a third embodiment.

Figure 8:
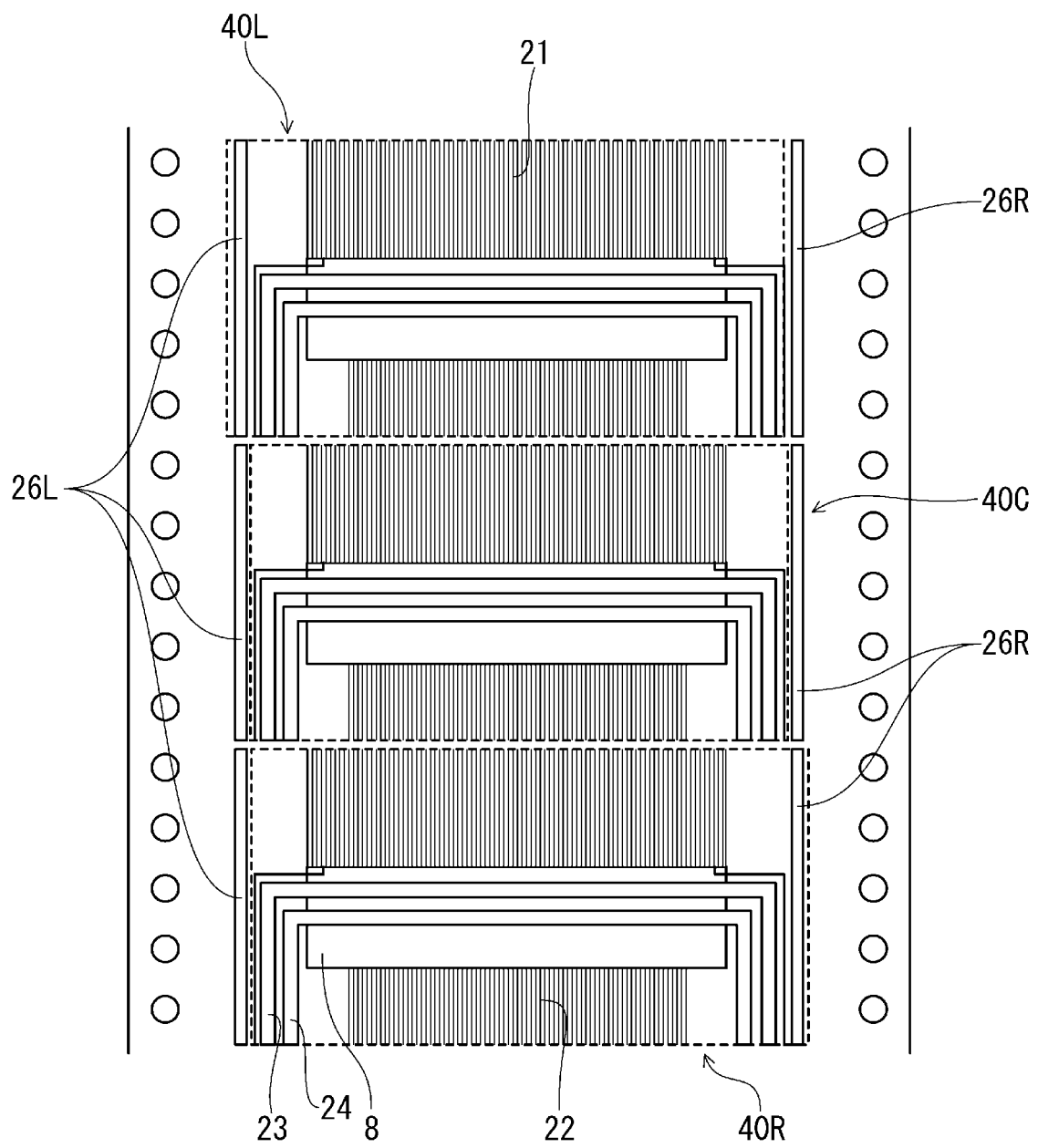

FIG. 8 is a diagram illustrating flexible substrates formed in a sprocket film.

Figure 9:
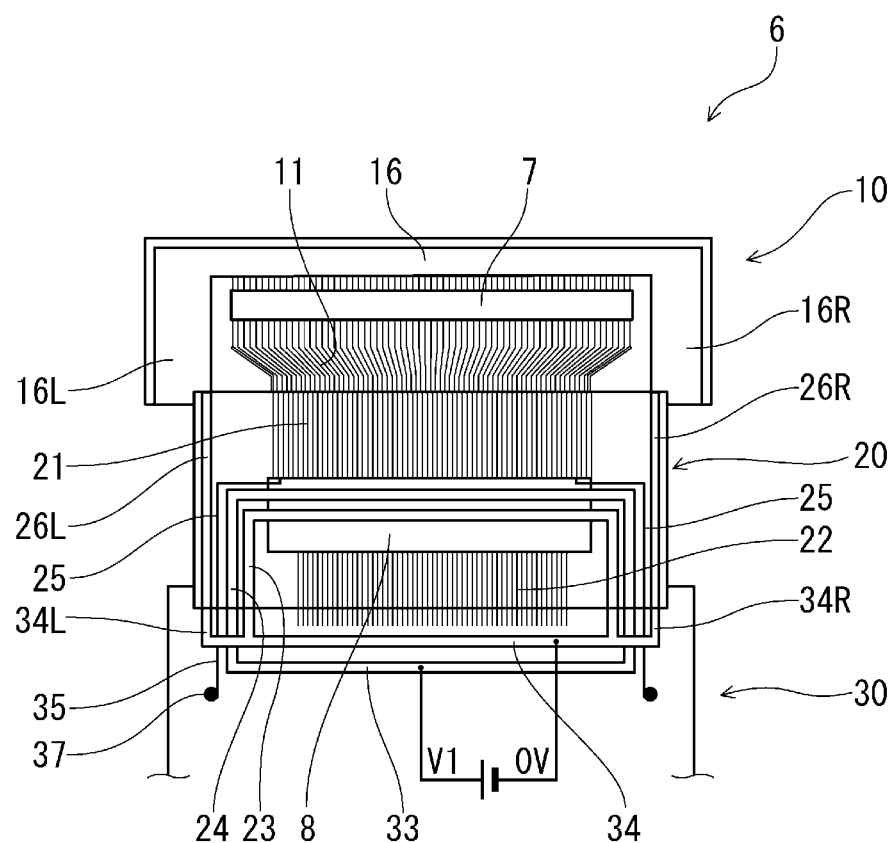

FIG. 9 is a diagram illustrating an inkjet head according to a fourth embodiment.

Figure 10:
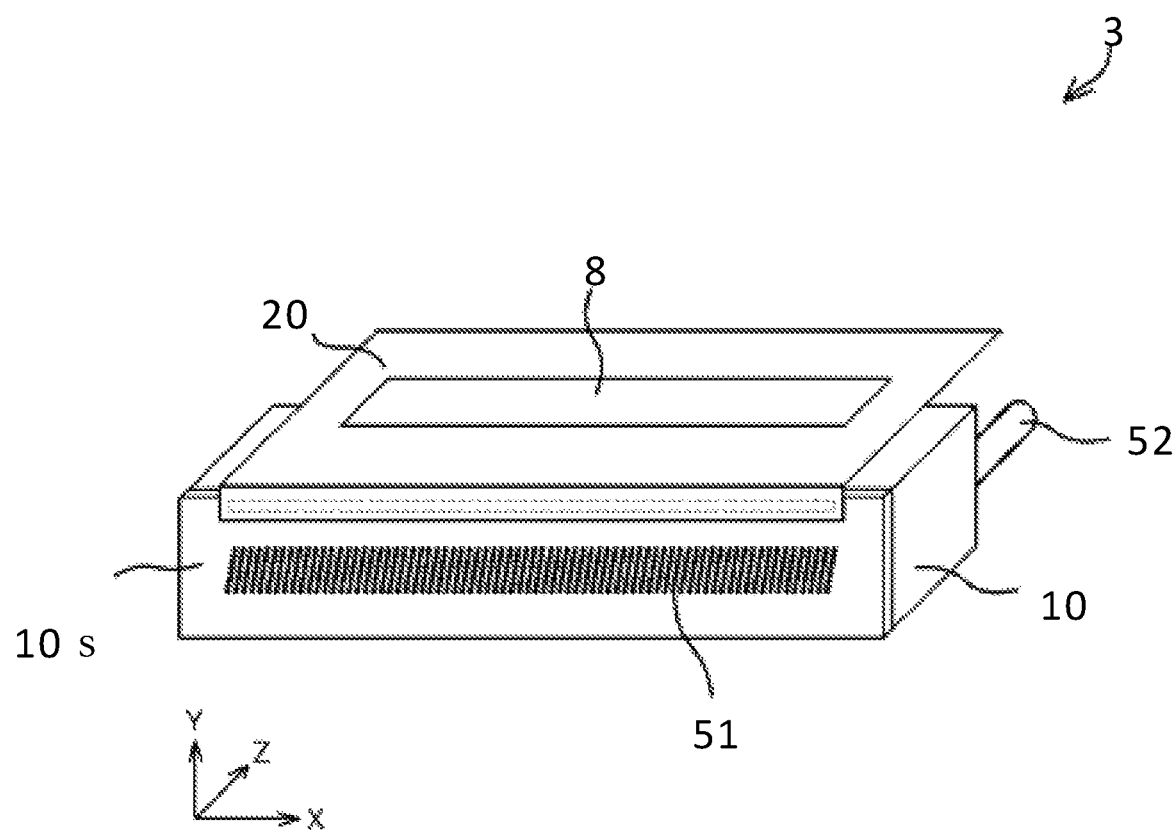

FIG. 10 illustrates a perspective view of the inkjet head.

Figure 11:
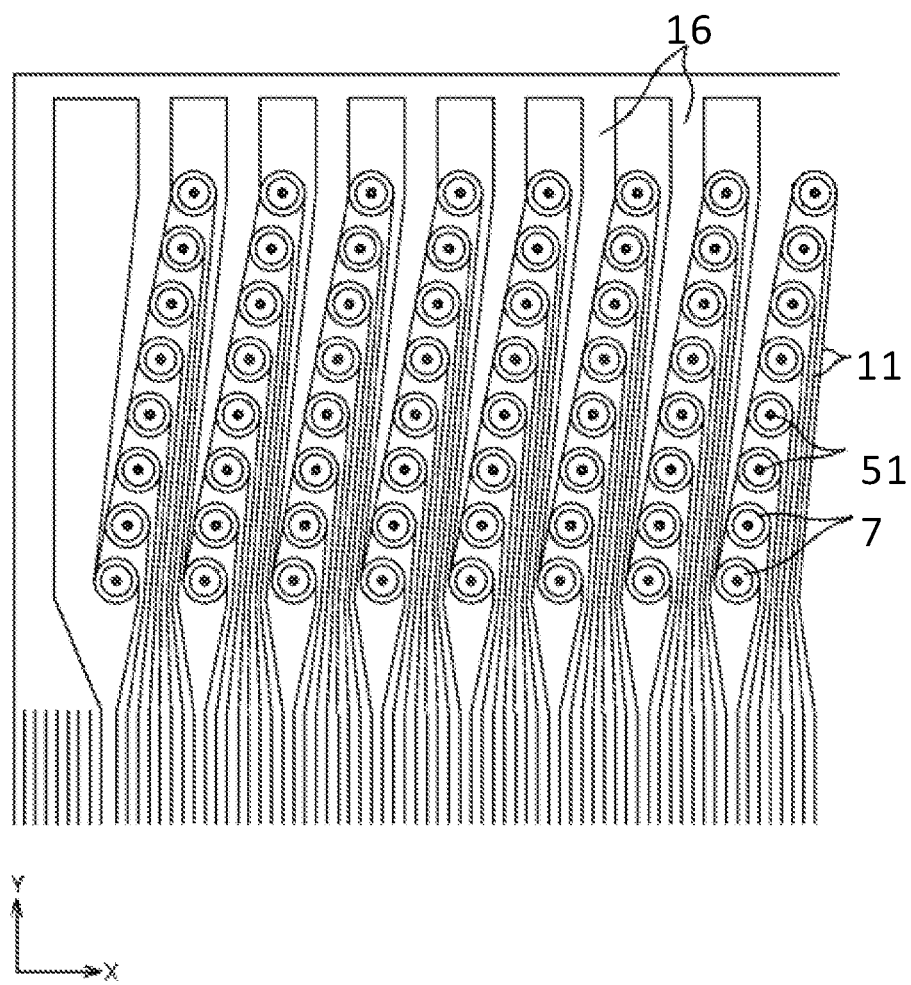

FIG. 11 illustrates a partially enlarged view of a front surface of the head substrate.

Figure 12A:
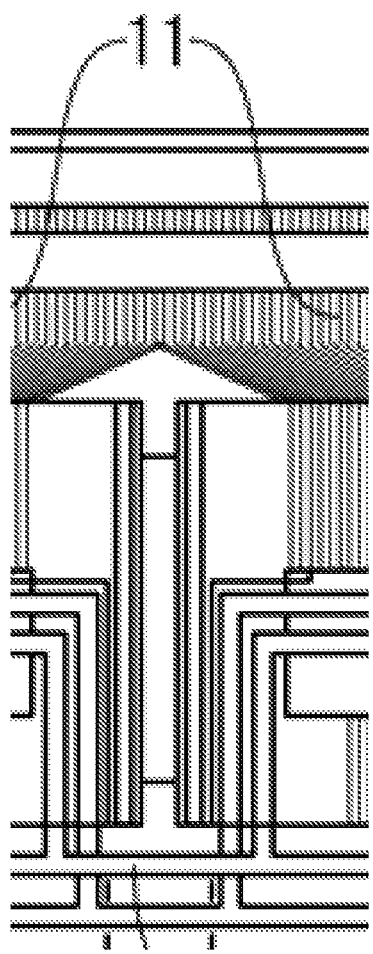
Figure 12B:
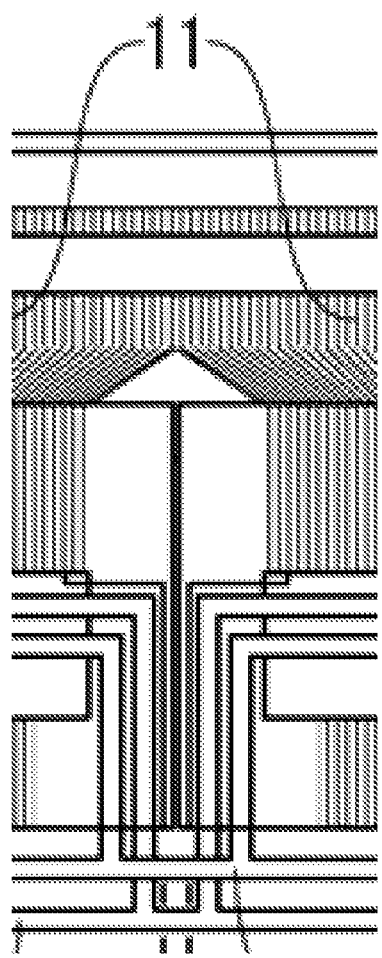

FIGS. 12A and 12B are diagrams illustrating enlarged views of ink jet heads, where FIG. 12A illustrates two flexible substrates separated from each other, and FIG. 12B illustrates two flexible substrates arranged in the vicinity of each other.

DETAILED DESCRIPTION

An embodiment is directed to providing an inkjet head, an inkjet printer, a manufacturing method for the inkjet head that can avoid complication and thinning of a common wire on a flexible substrate on which a driving IC that drives a plurality of elements is mounted and prevent deterioration in discharge characteristics.

An ink jet head includes a head substrate, a printed board, and a plurality of flexible substrates connected in parallel to each other between the head substrate and the printed board. The head substrate includes thereon a plurality of ink jet elements configured to cause ink to be ejected from a plurality of nozzles, and a common wire extending from an edge of the head substrate and electrically connected to the ink jet elements in common. The printed board includes, thereon, a reference potential wire through which a reference potential is set to the ink jet head. A first one of the flexible substrates at a first end of an arrangement of the flexible substrates and a second one of the flexible substrates at a second end of the arrangement of the flexible substrates opposite to the first end each has a common connection wire electrically connected between the common wire and the reference potential wire.

Inkjet heads and inkjet printers according to example embodiments are explained below with reference to the drawings. In the figures, the same components are denoted by the same reference numerals and signs.

First Embodiment

Inkjet Head 3

Figure 1A:
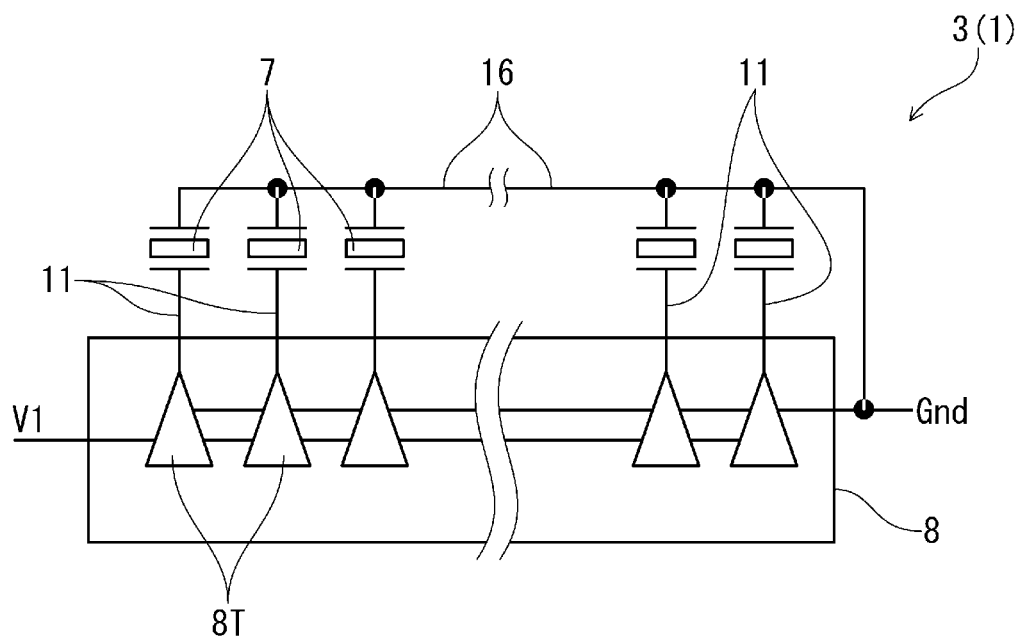
FIGS. 1A and 1B are diagrams illustrating a schematic configuration of an electric circuit of an inkjet head according to a first embodiment, FIG. 1A illustrating a general example and FIG. 1B illustrating a modification.
Figure 1B:
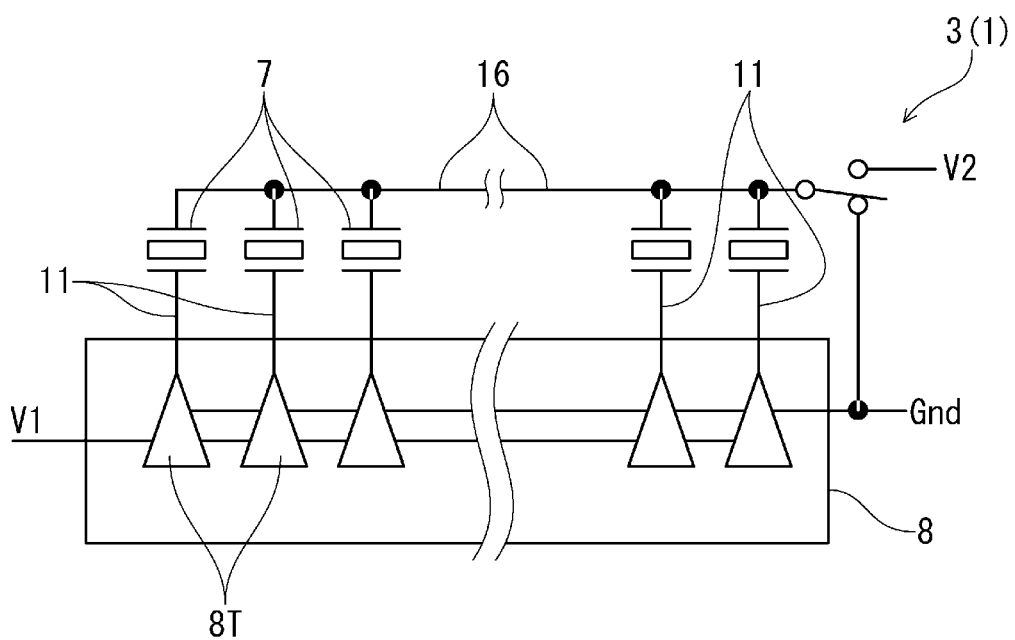

FIGS. 1A and 1B are diagrams illustrating a schematic configuration of an electric circuit of an inkjet head 3 according to a first embodiment. FIG. 1A illustrates an example, and FIG. 1B illustrates a modification example.

An inkjet printer 1 includes a plurality of inkjet heads 3. The inkjet printer 1 includes an ink supplying section that supplies ink toward the inkjet heads 3, a medium conveying section that conveys a recording medium toward the inkjet heads 3, and a printer control section.

Each of the inkjet heads 3 includes a plurality of actuators 7 and a driving IC 8. The driving IC 8 includes a driving circuit including output transistors 8T.

One end of each actuator 7 is connected to an individual wire 11. The other end of each actuator 7 is connected to a common wire 16.

The individual wires 11 are wires individually connected for each of the actuators 7. The individual wires 11 are connected to the driving IC 8. The common wire 16 is a shared wire connected to the actuators 7. The common wire 16 is grounded. That is, the actuators 7 are connected to a driving circuit of the driving IC 8 via separate individual wires 11 and connected to reference potential GND (0 V) via the common wire 16 shared by actuators 7.

The driving circuit of the driving IC 8 selectively controls the output transistors 8T to supply a driving potential V1 or a reference potential GND. If the driving circuit of the driving IC 8 controls the output transistors 8T to the driving potential V1, the driving potential V1 is charged in the actuators 7. If the driving circuit of the driving IC 8 controls the output transistors 8T to the reference potential GND, the actuators 7 are discharged to the reference potential GND.

FIGS. 2A and 2B are diagrams illustrating the inkjet head 3 according to the first embodiment. FIG. 2A illustrates the inkjet head 3 before bonding. FIG. 2B illustrates the inkjet head 3 after the bonding. For convenience of explanation, wires and the like are illustrated as being seen through flexible substrates 20 and a relay substrate 30.

FIGS. 3A to 3E are diagrams illustrating the inkjet head according to the first embodiment. FIG. 3A is a cross-sectional view along A-A in FIG. 2B. FIG. 3B is a cross-sectional view along B-B in FIG. 2B. FIG. 3C is an enlarged view of a part C in FIG. 2B. FIG. 3D is an enlarged view of a part D in FIG. 2B. FIG. 3E is an enlarged view of a part E in FIG. 2B. In FIGS. 3C to 3E, for convenience of explanation, only wires are illustrated.

The inkjet head 3 includes a head substrate 10, flexible substrates 20, and a relay substrate 30.

On the head substrate 10, the plurality of actuators 7 corresponding to ink chambers, respectively, are disposed. The flexible substrates 20 and the relay substrate 30 are bonded to the head substrate 10.

In the following explanation, the longitudinal (length) direction of the head substrate 10 is referred to as X direction or left-right direction. +X direction is referred to as a right direction and −X direction is referred to as a left direction. An end portion (a first end) in −X direction and an end portion (a second end) in +X direction are collectively referred to as both ends.

The short side (width) direction of the head substrate 10 is referred to as Y direction or up-down direction. +Y direction is referred to as an upper direction or an output direction and −Y direction is referred to as a lower direction or an input direction.

The thickness direction of the head substrate 10 is referred to as Z direction. +Z direction is referred to as a front direction and −Z direction is referred to as a rear direction.

Electrical coupling is referred to as "connecting" and physical coupling is referred to as "bonding."

The head substrate 10, the flexible substrates 20, and the relay substrate 30 are sequentially bonded in Y direction. The head substrate 10 is disposed in +Y direction with respect to the flexible substrates 20 and the relay substrate 30 is disposed in −Y direction with respect to the flexible substrates 20. Two flexible substrates 20 are disposed in parallel between the head substrate 10 and the relay substrate 30.

Side edge portions 20a on the output side of the flexible substrates 20 are disposed on a side edge portion 10b on the input side of the head substrate 10. Side edge portions 20b on the input side of the flexible substrates 20 are disposed on a side edge portion 30a on the output side of the relay substrate 30.

Head Substrate 10

FIG. 10 illustrates a perspective view of the inkjet head 3. FIG. 11 illustrates a partially enlarged view of a front surface (nozzle plate) 10s of the head substrate 10. The head substrate 10 is a hard single-side substrate made of silicon or glass. The plane shape of the head substrate 10 is a rectangle. The head substrate 10 includes the plurality of actuators 7. The actuators 7 are piezoelectric elements, for example. The plurality of actuators 7 are microelectromechanical systems (MEMSs) and disposed on a surface 10s of the head substrate 10. The actuator 7, which is a driving source for ejecting ink, is provided for each nozzle 51. Each of the actuators 7 is formed in an annular shape, and the actuators 7 are arranged so that the nozzles 51 are located at the center thereof.

The plurality of actuators 7 are disposed in parallel along the left-right direction. The number of the actuators forming one row is, for example, twenty. In one implementation, the actuator 7 includes eight actuators 7 arranged in Y axis direction as one set in X axis direction. For example, 150 sets are arranged in X axis direction, and a total of 1200 actuators 7 are arranged.

A plurality of nozzles 51 for ejecting ink are arranged on a front surface 10s of the head substrate 10. The nozzles 51 are two-dimensionally arranged in the column direction (X direction) and the row direction (Y direction). However, the nozzles 51 arranged in the row direction (Y direction) are arranged obliquely so that the nozzles 51 do not overlap on the axis of the Y axis. The ink ejected from each nozzle 51 is supplied from the ink supply path 52 communicating with the nozzle 51.

The head substrate 10 includes the individual wires 11 and the common wire 16. The individual wires 11 and the common wire 16 are connected to the actuators 7.

The individual wires 11 are a plurality of wires disposed in parallel from the actuators 7 to the side edge portion 10b on the input side on the surface 10s. The driving potential V1 or the reference potential GND is supplied to the individual wires 11.

The number of the individual wires 11 is the same as the number of the actuators 7. The number of the individual wires 11 is, for example, 1200.

Wirings extending from the actuators 7 to the common wire 16 are divided and disposed in parallel to each other from the actuators 7 toward a side edge portion 10a on the output side on the surface 10s. These wirings connected to the actuators 7 are commonly connected to the common wire 16 at the side edge portion 10a, and the common wire 16 is disposed toward left and right both ends along the side edge portion 10a. Further, the common wire 16 is disposed from the left and right both ends of the side edge portion 10a to the side edge portion 10b along side edge portions 10c and 10d on the left and right sides. That is, the common wire 16 is one wire. The common wire 16 is disposed along the side edge portions 10a, 10c, and 10d excluding the side edge portion 10b and further divided from the side edge portion 10a and extending to the actuators 7.

The reference potential GND is supplied to the common wire 16.

At the side edge portion 10b of the head substrate 10, common wires 16L and 16R are respectively disposed at the left and right both ends. The plurality of individual wires 11 are disposed between the common wires 16L and 16R. The individual wires 11 are divided into two on the left and right sides of the side edge portion 10b. For example, five hundred individual wires 11 are disposed on the left side and five hundred individual wires are disposed on the right side of the side edge portion 10b.

Since the individual wires 11 are divided into two on the left and right sides of the side edge portion 10b, the individual wires 11 are disposed to incline with respect to X direction between the actuators 7 and the side edge portion 10b.

The individual wires 11 and the common wire 16 are formed of nickel, aluminum, or gold, an alloy of nickel, aluminum, or gold, or the like. The film thickness of conductors of the wires is relatively small because the wires are formed by a semiconductor process. Specifically, the individual wires 11 and the common wire 16 have a line thickness of 0.4 μm (see FIGS. 3A and 3B).

At the side edge portion 10b, the individual wires 11 have a line width of 20 μm, a wiring interval of 20 μm, and a disposition interval (pitch) of 40 μm. The common wires 16L and 16R have a line width of 0.8 mm (see FIGS. 3C and 3D).

Flexible Substrates 20

The flexible substrates 20 are single-sided and formed of a synthetic resin film such as polyimide or the like. The plane shape of the flexible substrates 20 is rectangular. The flexible substrates 20 may be referred to as flexible film circuit boards or flexible printed circuits (FPC) as well. A first flexible substrate 20L on the left side and a second flexible substrate 20R on the right side have the same shape and the same configuration.

Each of the flexible substrates 20 includes one driving IC 8. The driving IC 8 is mounted on a rear surface 20t of the flexible substrate 20, which is a surface opposite to a front surface of the flexible substrate 20 depicted in FIG. 2. The driving IC 8 is disposed along the left-right direction in the center of the flexible substrate 20. Terminals of the driving IC 8 are sealed by resin.

The flexible substrate 20 can be considered a package of the driving IC 8. Therefore, in a sealed state in which the driving IC 8 is mounted on the flexible substrate 20, the flexible substrate 20 may be referred to as a tape carrier package (TCP) or a chip-on-film (COF) package as well.

Each of the flexible substrates 20 includes output wires 21, input wires 22, a power supply wire 23, a ground wire 24, output monitor wires 25, and common connection wires 26.

The wires excluding the common connection wires 26 are connected to the driving IC 8. That is, the output wires 21, the input wires 22, the power supply wire 23, the ground wire 24, and the output monitor wires 25 are connected to the driving IC 8.

On the other hand, the common connection wires 26 are independently provided without being connected to the driving IC 8 and the other wires.

The output wires 21 are a plurality of wires disposed in parallel from the driving IC 8 to the side edge portion 20a on the output side on the rear surface 20t. The output wires are respectively connected to a plurality of output terminals provided on the rear surface of the driving IC 8. The driving potential V1 or the reference potential GND is supplied to the output wires 21.

The number of the output wires 21 is a half of the number of the individual wires 11. The number of the output wires 21 is, for example, six hundred.

The input wires 22 are a plurality of wires disposed in parallel to each other from the driving IC 8 to the side edge portion 20b on the input side on the rear surface 20t. The input wires 22 are respectively connected to a plurality of input terminals provided on the rear surface of the driving IC 8. A control signal is supplied to the input wires 22.

The number of the input wires 22 is less than the number of the output wires 21.

The power supply wire 23 and the ground wire 24 are wires crossing a mounting region of the driving IC 8 in the left-right direction, bent at substantially a right angle on left and right both end sides, and disposed in parallel to each other. That is, the power supply wire 23 and the ground wire 24 are disposed to surround the input wire 22 output side and the left and right both sides.

The power supply wire 23 is connected to a plurality of power supply terminals provided on the rear surface of the driving IC 8. The driving potential V1 is supplied to the power supply wire 23.

The ground wire 24 is connected to a plurality of ground terminals provided on the rear surface of the driving IC 8. The reference potential GND is supplied to the ground wire 24.

One power supply wire 23 and one ground wire 24 are provided. The power supply wire 23 is disposed on the output side and the left-right outer side. The ground wire 24 is disposed on the input side and the left-right inner side.

The output monitor wires 25 are two wires disposed from the driving IC 8 to the side edge portion 20b on the input side. Each of the output monitor wires 25 is connected to one of the plurality of output terminals provided on the rear surface of the driving IC 8. That is, each of the output monitor wires 25 is connected to one of the plurality of output wires 21. A driving waveform that changes between the driving potential V1 and the reference potential GND is supplied to the output monitor wires 25 by the driving IC 8.

One output monitor 25 is provided on the left side, and one output monitor 25 is provided on the right side. The output monitor wires 25 are drawn out from the end portions of the output wires 21, extended from the mounting region of the driving IC 8 to the left and right both ends, and further bent at a right angle and disposed to the side edge portion 20b. The output monitor wires 25 are disposed on the output side and the left-right outer side of the power supply wire 23 and disposed in parallel to the power supply wire 23.

The common connection wires 26 are two wires disposed in the up-down direction along left and right side edge portions 20c and 20d on the rear surface 20t. That is, a common connection wire 26L is disposed at the leftmost edge and a common connection wire 26R is disposed at the rightmost edge. The common connection wires 26L and 26R are disposed to directly connect the side edge portion 20b and the side edge portion 20a without being connected to the driving IC 8 and the like. The reference potential GND is supplied to the common connection wires 26.

The ground wire 24 and the common connection wires 26 are separated from each other. In other words, the ground wire 24 and the common connection wires 26 are connected to the relay substrate 30 independently from each other and connected to each other on the relay substrate 30.

The plurality of input wires 22 are disposed side by side at the side edge portion 20b of the flexible substrate 20. The ground wire 24 is disposed on the outer side of the plurality of input wires 22. The power supply wire 23 is disposed on the outer side of the ground wire 24. Since the flexible substrate 20 is single-sided, the wires on the flexible substrate 20 cannot extend across the other wires.

However, the common connection wires 26 and the driving IC 8 are separated on the flexible substrate 20. Therefore, paths of the output monitor wires 25 can be disposed to start from any ones of the output wires 21, pass between the common connection wires 26 and the power supply wire 23, and reach the side edge portion 20b without extending across the other wires.

The power supply wire 23 is not always disposed on the outer side of the ground wire 24. The ground wire 24 may be disposed on the outer side of the power supply wire 23.

The output wires 21, the input wires 22, the power supply wire 23, the ground wire 24, the output monitor wires 25, and the common connection wires 26 are formed of copper. These wires are formed by laminating the copper on a polyimide film using an adhesive or with electrolytic plating and thereafter patterning the copper. Therefore, these wires have a larger conductor thickness compared with the wires (the individual wires 11 and the common wire 16) on the head substrate 10. These wires have a line thickness of 8 µm (see FIGS. 3A and 3B).

At the side edge portion 20a, the output wires 21 have a disposition interval (pitch) of 40 µm, which is the same as the disposition interval of the individual wires 11. The output wires 21 have a line width of 18 µm, which is smaller than the line width of the individual wires 11. The output wires 21 have a wiring interval of 22 µm, which is larger than the wiring interval of the individual wires 11 (see FIG. 3D).

The conductors (e.g., wires) on the flexible substrate 20 have thickness approximately twenty times the thickness of the conductors on the head substrate 10. Therefore, the sheet resistance of the conductors on the flexible substrate 20 is substantially lower than the conductors on the head substrate 10. Wiring resistance greatly increases if the line width of the conductors on the head substrate 10, which have high sheet resistance, is reduced. On the other hand, the resistance increase would be relatively small even if the line width of the conductors on the flexible substrate 20, which have a low sheet resistance, is reduced. The width of the output wires 21 on the polyimide film, is set as narrow as 18 µm and the wiring interval of the output wires 21 is set as wide as 22 µm. Consequently, it is possible to prevent an insulation failure even if deviation occurs during connection while reducing the resistance increase.

The common connection wires 26 have a line width of 0.4 mm, which is a half of the line width of the common wires 16L and 16R (see FIG. 3C).

The conductors (e.g., the wires) on the flexible substrate 20 have a thickness approximately twenty times the thickness of the conductors on the head substrate 10. Therefore, the sheet resistance of the conductors on the flexible substrate 20 is lower than the sheet resistance of the conductors on the head substrate 10. Wiring resistance greatly increases if the line width of the conductors on the head substrate 10, which have high sheet resistance, is reduced. On the other hand, a resistance increase would be relatively small if the line width of the conductors on the flexible substrate 20, which have a low sheet resistance, is reduced. It is thus possible to reduce the length in X direction of the polyimide film while limiting a resistance increase by setting the width of the conductors of the common connection wires 26 on the polyimide film side to 0.4 mm. Consequently, it is possible to improve bonding of the flexible substrate 20 and the head substrate 10, reduce manufacturing cost, and reduce cost of the film.

At the side edge portion 20a of the flexible substrate 20, the common connection wires 26L and 26R are disposed at the left and right both ends. The plurality of output wires 21 are disposed in the center of the side edge portion 20a.

Consequently, if the flexible substrate 20L is bonded to the left side of the side edge portion 10b of the head substrate 10, the common connection wire 26L is connected to the common wire 16L and the output wires 21 are respectively connected to the individual wires 11 (connected parts). The common connection wire 26R of the flexible substrate 20L may not be connected to any wires of the head substrate 10 and the relay substrate 30, and therefore may be referred to as a dummy wire.

If the flexible substrate 20R is bonded to the right side of the side edge portion 10b of the head substrate 10, the common connection wire 26R is connected to the common wire 16R and the output wires 21 are respectively connected to the individual wires 11 (connected parts).

The flexible substrate 20 and the head substrate 10 are connected via an anisotropic conductive film (ACF). The ACF is disposed between the side edge portion 20a of the rear surface 20t of the flexible substrate 20 and the side edge portion 10b of the surface 10s of the head substrate 10.

If the ACF is sandwiched between the flexible substrate 20 and the head substrate 10 and thermocompression-bonded by a heater or the like, the flexible substrate 20 and the head substrate 10 can be bonded and the wires can be electrically connected. For example, the common wires 16L and 16R and the common connection wires 26L and 26R are electrically connected. The common connection wire 26L of the flexible substrate 20L may not be connected to any wires of the head substrate 10 and the relay substrate 30, and therefore may be referred to as a dummy wire.

If extension of the flexible substrate 20 during the thermocompression bonding is not negligible, the disposition interval (pitch) may be formed narrow than 40 µm in a state before connection and increased to 40 µm after the connection.

At the side edge portion 20b of the flexible substrate 20, the common connection wires 26L and 26R are disposed at the left and right both ends. The plurality of input wires 22 are disposed in the center of the side edge portion 20b. Further, the output monitor wires 25, the power supply wire 23, and the ground wire 24 are disposed between the common connection wire 26L and the input wires 22. Similarly, the output monitor wires 25, the power supply wire 23, and the ground wire 24 are disposed between the common connection wire 26R and the input wires 22.

At the edge 20b, the line width, the wiring interval, and the arrangement interval (pitch) of the input wirings 22 are 0.15 mm, 0.15 mm, and 0.3 mm, respectively (see FIG. 3E). The line width of the output monitor wirings 25 is 100 µm. The line widths of the power source wiring 23, the ground wiring 24, and the common connection wiring 26 are 0.4 mm.

Relay Substrate 30

The relay substrate 30 is a hard substrate obtained by laminating epoxy resin layers with glass fibers and copper wiring layers. The relay substrate 30 may be a printed circuit board or the like. The relay substrate 30 may be referred to as a "printed board" in some contexts. The plane shape of the relay substrate 30 is rectangular.

The relay substrate 30 includes electronic components and connectors. The relay substrate 30 also includes input wires 32, a power supply wire 33, a ground wire 34, and output monitor wires 35.

The input wires 32, the power supply wire 33, and the ground wire 34 are connected to the connectors.

The output monitor wires 35 are connected to monitor pins 37 vertically provided on a surface 30s of the relay substrate 30.

The input wires 32 are disposed in parallel to each other from the side edge portion 30a on the output side toward the connectors. The input wires 32 are exposed on the surface 30s at the side edge portion 30a and disposed in an inner layer in portions other than the side edge portion 30a.

The number of the input wires 32 is the same as the number of the input wires 22.

A control signal for the driving IC 8 is input (supplied) to the input wires 32 from the printer control section by serial communication. That is, a control signal for controlling the actuators 7 is input (supplied) to the input wires 32 from the printer control section via the connectors and the like.

The power supply wire 33 and the ground wire 34 are wires disposed in parallel to each other from the side edge portion 30a toward the connectors. The power supply wire 33 is exposed on the surface 30s at the side edge portion 30a and disposed in an inner layer in portions other than the side edge portion 30a. The ground wire (a reference potential wire) 34 is exposed on the surface 30s at the side edge portion 30a.

The power supply wire 33 is divided into four at the side edge portion 30a. Two power supply wires 33 are disposed on the left side, and two power supply wires 33 are disposed on the right side of the side edge portion 30a.

The driving potential V1 for driving the actuators 7 is supplied to the power supply wire 33 from the power supply section (see FIG. 2B) via the connectors and the like.

The ground wire 34 is divided into six at the side edge portion 30a. Two ground wires 34 are disposed on the left side and two ground wires 34 are disposed on the right side of the side edge portion 30a. Further, one ground wire 34 is disposed at the left end and one ground wire 34 is disposed at the right end of the side edge portion 30a (ground wires 34L and 34R).

On the left and right sides of the side edge portion 30a, the two ground wires 34 are disposed in parallel to each other on the inner side of the two power supply wires 33. At the left and right both ends of the side edge portion 30a, the ground wires 34L and 34R are disposed in parallel to each other on the outer side of the power supply wire 33.

The reference potential GND for discharging the actuators 7 is supplied to the ground wire 34 from the power supply section via the connectors.

The output monitor wires 35 are four wires disposed from the side edge portion 30a to four monitor pins 37. The four monitor pins 37 may be disposed in any places on the surface 30s of the relay substrate 30. In the inkjet head 3, it is sometimes necessary to adjust a driving waveform according to characteristics of ink. In that case, the driving waveform can be monitored by connecting a measuring device such as an oscilloscope to the four monitor pins 37.

The output monitor wires 35 are exposed to the surface 30s at the side edge portion 30a and disposed in an inner layer in portions other than the side edge portion 30a.

At the side edge portion 30a, the output monitor wires 35 are disposed on the outer side of the power supply wire 33.

In the center of the side edge portion 30a, the two output monitor wires 35 are disposed in parallel to each other. At the left and right both ends of the side edge portion 30a, the output monitor wires 35 are disposed in parallel to each other between the ground wires 34L and 34R and the power supply wire 33.

The input wires 32, the power supply wire 33, the ground wire 34, and the output monitor wires 35 are formed of copper. The input wires 32, the power supply wire 33, the ground wire 34, and the output monitor wires 35 have a line thickness of 35 µm (see FIGS. 3A and 3B). The conductors (the wires) on the relay substrate 30 have a larger line thickness compared with the conductors on the flexible substrate 20.

At the side edge portion 30a, the input wires 32 have a arrangement interval (pitch) of 0.3 mm, which is the same as the arrangement interval of the input wires 22. The input wires 32 have a line width of 0.1 mm, which is smaller than the line width of the input wires 22. The input wires 32 have a wiring interval of 0.2 mm, which is larger than the wiring interval of the input wires 22 (see FIG. 3E).

Since the conductors (e.g., the wires) on the relay substrate 30 have thickness approximately four times the thickness of the conductors on flexible substrate 20, the sheet resistance of the conductors on the relay substrate 30 is smaller than compared with the wires on the head substrate 10. Therefore, in the relay substrate 30, a resistance increase would be relatively small even if the line width of the conductors is reduced.

The width of the conductors on the input wires 32 on the relay substrate side, where the influence of the resistance increase would be relatively small even if the width of the conductors is reduced, is set to 0.1 mm to be smaller than the width 0.15 mm of the conductors of the input wires 22. Consequently, it is possible to prevent an insulation failure even if deviation occurs during connection while reducing the resistance increase by setting the wiring interval of the input wires 32 as wide as 0.2 mm.

That is, the relation between the input wires 32 on the relay substrate 30 and the input wires 22 on the flexible substrate 20 is the same as the relation between the individual wires 11 on the head substrate 10 and the output wires 21 on the flexible substrate 20 explained above.

If two wiring boards having different sheet resistances are connected, a line width and a wiring interval of first wires on the first wiring board having a larger sheet resistance can be set to 1:1. Even if second wires on a second wiring board have a smaller sheet resistance and the same pitch as the pitch of the first wires, a line width of the second wires could be set narrower than a wiring interval of the second wires. Consequently, it is possible to obtain connection that is less likely to cause an insulation failure even if deviation occurs during connection while reducing a resistance increase.

At the side edge portion 30a, the power supply wire 33 and the ground wire 34 have a line width of 0.4 mm. The output monitor wires 35 have a line width of 100 µm.

At the side edge portion 30a of the relay substrate 30, the ground wire 34L, the output monitor wires 35, the power supply wire 33, the ground wire 34, the plurality of input wires 32, the ground wire 34, the power supply wire 33, and the output monitor wires 35 are disposed in this order from the left side toward the center.

At the side edge portion 30a of the relay substrate 30, the ground wire 34R, the output monitor wires 35, the power supply wire 33, the ground wire 34, the plurality of input wires 32, the ground wire 34, the power supply wire 33, and the output monitor wires 35 are disposed in this order from the right side toward the center.

Consequently, if the flexible substrate 20L is bonded to the left side of the side edge portion 30a of the relay substrate 30, the wires are connected. That is, the input wires 32 are connected to the input wires 22, the power supply wire 33 is connected to the power supply wire 23, the ground wire 34 is connected to the ground wire 24, the output monitor wires 35 are connected to the output monitor wires 25, and the ground wire 34L is connected the common connection wire 26L on the flexible substrate 20L.

If the flexible substrate 20R is bonded to the right side of the side edge portion 30a of the relay substrate 30, the wires are connected. That is, the input wires 32 are connected to the input wires 22, the power supply wire 33 is connected to the power supply wire 23, the ground wire 34 is connected to the ground wire 24, the output monitor wires 35 are connected to the output monitor wires 25, and the ground wire 34R is connected to the common connection wire 26R on the flexible substrate 20R.

The relay substrate 30 and the two flexible substrates 20 are connected via ACFs. The ACFs are disposed between the side edge portion 30a of the surface 30s of the relay substrate 30 and the side edge portions 20b of the rear surfaces 20t of the flexible substrates 20.

If the ACFs are sandwiched between the side edge portion 30a of the relay substrate 30 and the side edge portions 20b of the flexible substrates 20 and thermocompression-bonded by a heater or the like, the relay substrate 30 and the two flexible substrates 20 are bonded. Further, the wires are electrically connected. For example, the common connection wires 26L and 26R and the ground wires 34L and 34R are electrically connected.

FIG. 4 is a diagram illustrating the flexible substrates 20 formed in a sprocket film F. For convenience of explanation, the flexible substrates 20 are illustrated as being seen through a synthetic resin film.

A plurality of flexible substrates 20 are formed to be continuous on the sprocket film F made of synthetic resin such as polyimide. The plurality of flexible substrates 20 are supplied to an assembly factory or the like for the inkjet heads 3 while still in the sprocket film F state.

When the respective flexible substrates 20 are cut from the sprocket film F, the outer peripheries (depicted as broken lines in FIG. 4) are cut. The flexible substrates 20 can be bonded to the head substrate 10 and the like as the flexible substrates 20 (20L and 20R).

In this way, in the inkjet head 3, it is possible to avoid complicated and thin common wires (e.g., the ground wire 24 and the common connection wires 26) on the flexible substrate 20 on which the driving IC 8 that drives the actuators 7 is mounted. Therefore, the inkjet head 3 is less likely to be affected by noise. It is possible to provide the inkjet printer 1 that can prevent deterioration in a discharge characteristic.

As explained above, the common wire 16 formed in the head substrate 10 of the inkjet head 3 has the line thickness (the conductor thickness) of 0.4 μm and is extremely thin. Unlike the individual wires 11, a large electric current flows to the common wire 16 because driving currents of all the actuators 7 gather in the common wire 16. Therefore, the common wire 16 needs to have a line width (a conductor width) eighty times the line width of the individual wires 11. Accordingly, the two common wires 16 having a line width of 0.8 mm are disposed at the side edge portion 10b.

The common connection wires 26 formed on the flexible substrates 20 have the line thickness of 8 μm and have thickness twenty times the thickness of the common wire 16. Therefore, even if the line width of the common connection wires 26 is a half (0.4 mm) of the line width (0.8 mm) of the common wire 16, the common connection wires 26 have low electric resistance because a conductor cross-sectional area is large.

If positional deviation in the left-right direction occurs in the bonding of the head substrate 10 and the flexible substrates 20, it is likely that parts of the common wire 16 and the common connection wires 26 are connected and electric resistance of the connected parts increases.

If the electric resistance of the connected parts of the common wire 16 and the common connection wires 26 is large, a driving voltage of the actuators 7 drops and stability of ink discharge may be impaired or the common wire 16 generates heat and durability of the common wire 16 may be impaired.

In the inkjet head 3, the common connection wires 26 having the small line width are superimposed on and connected to the common wire 16 having the large line width. Therefore, the common connection wires 26 can be surely disposed within a range of the line width of the common wire 16. The common wire 16 having a small conductor cross-sectional area and high electric resistance is completely connected to the common connection wires 26 having a large conductor cross-sectional area and low electric resistance. Therefore, an increase in the electric resistance of the connected parts can be avoided.

Therefore, positioning accuracy during the bonding of the head substrate 10 the flexible substrates 20 is not high. The bonding can be performed with a more tolerant positioning margin.

In the inkjet head 3, the ground wires 34L and 34R that supply the reference potential GND to only the actuators 7 are disposed on the relay substrate 30. Therefore, it is possible to optionally control a reference voltage supplied to the actuators 7 by providing switches or the like in the ground wires 34L and 34R.

For example, as illustrated in FIG. 1B, negative potential V2 can be supplied to the actuators 7 by switching the switches. Consequently, polarization processing of the actuators 7 can be performed.

A bias voltage applied to the actuators 7 can be adjusted by varying the potential V2.

In the inkjet head 3, the common connection wires 26 that supply the reference potential to the actuators 7 and the ground wire 24 that supplies the reference potential to the driving IC 8 are separately and independently provided on the flexible substrate 20. The output monitor wires 25 can be disposed between the output wires 21 of the driving IC 8 and the common connection wires 26. The output monitor wires 25 are connected to any ones of the plurality of output terminals of the driving IC 8 and connected to the output monitor wires 35 of the relay substrate 30

According to this configuration, an output waveform of the driving IC 8 can be monitored on the relay substrate 30. In other words, unlike the past, it is unnecessary to monitor the output waveform of the driving IC 8 on the flexible substrate 20.

Therefore, it is possible to easily monitor the output waveform of the driving IC 8 during development and during failure analysis of the inkjet head 3.

Second Embodiment

Inkjet Head 4

FIGS. 5A and 5B are diagrams illustrating an inkjet head 4 according to a second embodiment. FIG. 5A illustrates the inkjet head 4 before bonding. FIG. 5B illustrates the inkjet head 4 after the bonding. For convenience of explanation, wires and the like are illustrated as being seen through flexible substrates 40 and the relay substrate 30.

The same components as the components of the inkjet head 3 according to the first embodiment are denoted by the same reference numerals and signs. Explanation of the repeated components is omitted.

The inkjet head 4 includes the head substrate 10, the flexible substrates 40, and the relay substrate 30. Two flexible substrates 40 are disposed in parallel between the head substrate 10 and the relay substrate 30.

Flexible Substrates 40

The flexible substrates 40 have substantially the same configuration as the flexible substrates 20.

A flexible substrate 40L on the left side does not include the common connection wire 26R. A flexible substrate 40R on the right side does not include the common connection wire 26L. That is, the flexible substrate 40L is obtained by removing the common connection wire 26R from the flexible substrate 20. The flexible substrate 40R is obtained by removing the common connection wire 26L from the flexible substrate 20.

FIG. 6 is a diagram illustrating the flexible substrates formed in the sprocket film F. For convenience of explanation, the flexible substrates 40 are illustrated as being seen through a synthetic resin film.

A plurality of flexible substrates 40 are formed to be continuous on the sprocket film F. The plurality of flexible substrates 40 are supplied to an assembly factory or the like of the inkjet heads 4 while still in the sprocket film F state.

The flexible substrate 40 formed in the sprocket film F has the same configuration as the configuration of the flexible substrate 20 according to the first embodiment. That is, the flexible substrate 40 formed in the sprocket film F includes two common connection wires 26.

When the respective flexible substrates 40R are cut from the sprocket film F, the common connection wire 26L is left on the sprocket film F (depicted as a broken line in FIG. 6). That is, the common connection wire 26L is removed from the flexible substrate 40. The flexible substrate 40 can be bonded to the head substrate 10 or the like as the flexible substrate 40R.

When the respective flexible substrates 40L are cut from the sprocket film F, the common connection wire 26R is left on the sprocket film F (depicted as a broken line in FIG. 6). That is, the common connection wire 26R is removed from the flexible substrate 40. The flexible substrate 40 can be bonded to the head substrate 10 or the like as the flexible substrate 40L.

The inkjet head 4 achieves the same operational effect as the operational effect of the inkjet head 3. That is, it is possible to avoid complication and thinning of the common wires (e.g., the ground wire 24 and the common connection wires 26) on the flexible substrate 40 on which the driving IC 8 that drives the actuators 7 is mounted. Therefore, it is possible to provide the inkjet printer 1 that can prevent deterioration in a discharge characteristic.

Further, the inkjet head 4 can improve manufacturing efficiency. That is, if the respective flexible substrates 40 are cut off from the sprocket film F, cut lines are varied. Consequently, it is possible to cut out the flexible substrates 40L and 40R from the sprocket film F on which the plurality of flexible substrates 40 all have the same initial configuration.

Since only the cut lines need to be differentiated, manufacturing efficiency can be improved. Since it is unnecessary to manufacture a plurality of types of substrates, cost can be reduced.

As explained above, in the inkjet head 4, the flexible substrate 40L on the left side does not include the common connection wire 26R and the flexible substrate 40R on the right side does not include the common connection wire 26L. Therefore, the width of the two flexible substrates 40 is smaller compared with the first embodiment. Consequently, in the head substrate 10, the plurality of individual wires 11 divided into two to the left and the right can be disposed close to the center. That is, an arranging direction of the individual wires 11 can be aligned with the up-down direction.

If the individual wires 11 are inclined with respect to X direction, electric resistances of the individual wires 11 may become nonuniform and insulation reliability may be deteriorated. Further, this may decrease a yield of the head substrate 10.

FIGS. 12A and 12B are diagrams illustrating enlarged views of ink jet heads, where FIG. 12A illustrates two flexible substrates separated from each other, and FIG. 12B illustrates two flexible substrates arranged in the vicinity of each other.

In the inkjet head 4, an inclination of the discrete wirings 11 at a center region corresponding to a space between the two flexible substrate 40 can be decreased by disposing the two flexible substrates 40 close to each other in the left-right direction as in FIG. 12B as opposed to that shown in FIG. 12A. The individual wires 11 can be formed to extend along X direction. Consequently, the electric resistances of the individual wires 11 can become more uniform. The insulation reliability is improved. The yield of the head substrate 10 can be increased.

Third Embodiment

Inkjet Head 5

FIG. 7 is a diagram illustrating an inkjet head 5 according to a third embodiment. For convenience of explanation, wires and the like are illustrated as being seen through flexible substrates 40 and the relay substrate 30.

The same components as the components of the inkjet heads 3 and 4 according to the first and second embodiments are denoted by the same reference numerals and signs. Explanation of these repeated components is omitted.

The inkjet head 5 includes the head substrate 10, the flexible substrates 40, and the relay substrate 30. Three flexible substrates 40L, 40C, and 40R are disposed in parallel to each other between the head substrate 10 and the relay substrate 30.

Flexible Substrates 40

The flexible substrate 40L on the left side does not include the common connection wire 26R. The flexible substrate 40R on the right side does not include the common connection wire 26L. The flexible substrate 40C in the center does not include the common connection wires 26. That is, the flexible substrate 40C is obtained by removing the two common connection wires 26 from the flexible substrate 20.

FIG. 8 is a diagram illustrating the flexible substrates formed in the sprocket film F. For convenience of explanation, the flexible substrates 40 are illustrated as being seen through a synthetic resin film.

The flexible substrates 40 are formed continuously along length of the sprocket film F. The flexible substrates 40 formed in the sprocket film F each include the two common connection wires 26.

When the respective flexible substrates 40R are cut from the sprocket film F, the common connection wire 26L is left on the sprocket film F (depicted as a broken line in FIG. 8). The common connection wire 26L is removed from the flexible substrate 40. The flexible substrate 40 can be bonded to the head substrate 10 or the like as the flexible substrate 40R.

When the respective flexible substrates 40C are cut from the sprocket film F, the common connection wires 26L and 26R are left on the sprocket film F (a broken line in FIG. 8). The common connection wire 26R is removed from the flexible substrate 40. The flexible substrate 40 can be bonded to the head substrate 10 or the like as the flexible substrate 40C.

When the respective flexible substrates 40L are cut from the sprocket film F, the common connection wire 26R is left on the sprocket film F (depicted as a broken line in FIG. 8). The common connection wire 26R is removed from the flexible substrate 40. The flexible substrate 40 can be bonded to the head substrate 10 or the like as the flexible substrate 40L.

The inkjet head 5 achieves the same operational effect as the operational effect of the inkjet heads 3 and 4. That is, it is possible to avoid complicated and thin common wires (e.g., the ground wire 24 and the common connection wires 26) on the flexible substrate 40 on which the driving IC 8 that drives the actuators 7 is mounted. Therefore, the inkjet head 5 is less likely to be affected by noise. It is possible to provide the inkjet printer 1 that can prevent deterioration in a discharge characteristic.

Further, like the inkjet head 4, the inkjet head 5 can improve manufacturing efficiency. That is, when the respective flexible substrates 40 are cut from the sprocket film F, cut lines can be varied. Consequently, it is possible to cut out the flexible substrates 40L, 40C, and 40R from a sprocket film F on which a plurality of flexible substrates 40 having the same configuration have been formed.

Since only the cut lines need to be differentiated, manufacturing efficiency can be improved. Since it is unnecessary to manufacture a plurality of types of substrates, cost can be reduced.

In the inkjet head 5, the flexible substrate 40L on the left side does not include the common connection wire 26R, and the flexible substrate 40R on the right side does not include the common connection wire 26L. The flexible substrate 40C does not include the common connection wires 26.

Consequently, in the inkjet head 5, as in the inkjet head 4, an arranging direction of the individual wires 11 can be aligned with the up-down direction. Therefore, electric resistances of the individual wires 11 become more uniform, insulation reliability is improved, and the yield of the head substrate 10 can be increased.

Fourth Embodiment

Inkjet Head 6

FIG. 9 is a diagram illustrating an inkjet head 6 according to a fourth embodiment. For convenience of explanation, wires and the like are illustrated as being seen through the flexible substrate 20 and the relay substrate 30.

The same components as the components of the inkjet heads 3 to 5 in the first to third embodiments are denoted by the same reference numerals and signs. Explanation of these components is omitted.

The inkjet head 6 includes the head substrate 10, the flexible substrate 20, and the relay substrate 30. One flexible substrate 20 is disposed between the head substrate 10 and the relay substrate 30.

The inkjet head 6 achieves the same operational effect as the operational effect of the inkjet heads 3 to 5. That is, it is possible to avoid complication and thinning of the common wires (e.g., the ground wire 24 and the common connection wires 26) on the flexible substrate 20 on which the driving IC 8 that drives the actuator 7 is mounted. Therefore, the inkjet head 6 is less likely to be affected by noise. It is possible to provide the inkjet printer 1 that can prevent deterioration in a discharge characteristic.

In the embodiments explained above, only one driving IC 8 may not necessarily be mounted on one flexible board. Two or more driving ICs 8 may be mounted on one flexible substrate. In this case, the two or more driving ICs 8 are disposed in series along the left-right direction.

Elements that cause the nozzles to discharge the ink are not limited to the actuators 7 formed by the piezoelectric elements. The elements may be heaters or solenoid valves, for example.

The substrate shapes are not limited to rectangular and may be a parallelogram, a trapezoid, or the like. The wires are not always linearly disposed or disposed in parallel. Various changes can be performed according to necessity.

The embodiments are presented as examples and are not intended to limit the scope of the present disclosure. These disclosed embodiments can be implemented in other various forms. Various omissions, substitutions, and changes can be made without departing from the spirit of the present disclosure. These embodiments and modifications are included in the scope and spirit of the present disclosure and are represented in the accompanying claims and their equivalents.

What is claimed is:

1. An ink jet head, comprising:
    a head substrate including thereon:
        a plurality of ink jet elements configured to cause ink to be ejected from a plurality of nozzles; and
        a common wire extending from an edge of the head substrate and electrically connected to the ink jet elements in common;
    a printed board with a reference potential wire through which a reference potential is provided to the ink jet head; and
    a plurality of flexible substrates connected in parallel to each other between the edge of the head substrate and an edge of the printed board,
    wherein
    a first one of the flexible substrates at a first end of an arrangement of the plurality of flexible substrates and a second one of the flexible substrates at a second end of the arrangement of the plurality of flexible substrates each has a common connection wire directly connected between a portion of the common wire at the edge of the head substrate and a portion of the reference potential wire at the edge of the printed board, and
    a line width of the portion of the common wire is greater than a line width of the common connection wire of the first one of the flexible substrates and greater than a line width of the common connection wire of the second one of the flexible substrates.

2. The ink jet head according to claim 1, wherein
the common connection wire of the first one of the flexible substrates is disposed along an outside edge thereof, and
the common connection wire of the second one of the flexible substrates is disposed along an outside edge thereof.

3. The ink jet head according to claim 1, wherein the plurality of flexible substrates includes at least three flexible substrates in total.

4. The ink jet head according to claim 3, wherein a third one of the flexible substrates is between the first one of the flexible substrates and the second one of the flexible substrates in the arrangement of the plurality of flexible substrate.

5. The ink jet head according to claim 4, wherein the third one of the flexible substrates has no common connection wire electrically connected between the common wire and the reference potential wire.

6. The ink jet head according to claim 4, wherein the third one of the flexible substrates has a dummy wire at a position of the third one of the flexible substrates corresponding to a position of the common connection wire on the first one of the flexible substrates.

7. The ink jet head according to claim 6, wherein the dummy wire is electrically isolated from any wire on the head substrate and any wire on the printed board.

8. The ink jet head according to claim 3, wherein a wire arrangement of the third one of the flexible substrates is the same as a wire arrangement of the first one of the flexible substrates except for the common connection wire thereof.

9. The ink jet head according to claim 5, wherein a wire arrangement of the third one of the flexible substrates is the same as a wire arrangement of the first one of the flexible substrates except for the common connection wire thereof.

10. The ink jet head according to claim 2, wherein the first one of the flexible substrates further includes a dummy wire extending between first and second edges thereof along an inside edge opposite to the outside edge.

11. The ink jet head according to claim 10, wherein the dummy wire is electrically isolated from any wire on the head substrate and any wire on the printed board.

12. The ink jet head according to claim 10, wherein the common connection wire and the dummy wire are disposed symmetrically with respect to a center line of the first one of the flexible substrates extending between the first and second edges.

13. The ink jet head according to claim 1, wherein a wire arrangement of the first one of the flexible substrates except for the common connection wire thereof is the same as a wire arrangement of the second one of the flexible substrates except for the common connection wire thereof.

14. The ink jet head according to claim 1, wherein
the first one of the flexible substrates includes no wire extending between first and second edges thereof at a position along an inside edge opposite to the outside edge, and
the second one of the flexible substrates includes no wire extending between first and second edges thereof at a position along an inside edge opposite to the outside edge.

15. The ink jet head according to claim 14, wherein a wire arrangement of the first one of the flexible substrates except for the common connection wire thereof is the same as a wire arrangement of the second one of the flexible substrates except for the common connection wire thereof.

16. The ink jet head according to claim 1, wherein a wire arrangement of the first one of the flexible substrates and a wire arrangement of the second one of the flexible substrates are symmetrical with respect to a center of the head substrate.

17. A method for manufacturing an ink jet head, comprising:
forming a sprocket film including a plurality of flexible substrate regions, each flexible substrate region including:
a first wire extending between a first end of the flexible substrate region and a second end of the substrate region opposite the first end along a third end of the flexible substrate region,
a second wire extending between the first and second ends of the flexible substrate region along a fourth end of the flexible substrate region opposite to the third end, and
a plurality of drive wires to be connected to a drive circuit configured to drive ink jet elements of an ink jet head;
cutting a first region from the sprocket film, the cut first region corresponding to a flexible substrate region with an end portion corresponding to the second wire being excluded; and
using the cut first region as a first flexible substrate having a drive circuit mounted thereon.

18. The method according to claim 17, further comprising:
cutting a second region from the sprocket film, the cut second region corresponding to a flexible substrate region with an end portion corresponding to the first wire being excluded; and
using the cut second region as a second flexible substrate having a second drive circuit mounted thereon, the second flexible substrate being connected to a head substrate including ink jet elements in parallel with the first flexible substrate.

19. The method according to claim 17, further comprising:
cutting a third region from the sprocket film, the cut third region corresponding to a flexible substrate region with an end portion corresponding to the first wire and an end portion corresponding to the second wire being excluded; and
using the cut third region as a third flexible substrate having a third drive circuit mounted thereon, the third flexible substrate being between the first flexible substrate and the second flexible substrate and connected in parallel with the first flexible substrate and the second flexible substrate.

20. The method according to claim 17, further comprising:
connecting the first wire of the first flexible substrate to a common wire of a head substrate that is electrically connected to common terminals of ink jet elements.

* * * * *